US006938235B2

(12) United States Patent
Breejen et al.

(10) Patent No.: US 6,938,235 B2
(45) Date of Patent: Aug. 30, 2005

(54) INTEGRATED CIRCUIT WITH AUTHOMATIC PIN-STRAPPING CONFIGURATION

(75) Inventors: Frank den Breejen, Tucson, AZ (US); David Michael Biven, Austin, TX (US); William James Torke, Cedar Creek, TX (US); William F. Gardei, Derry, NH (US)

(73) Assignee: Cirrus Logic, Inc., Austin, TX (US)

( * ) Notice: Subject to any disclaimer, the term of this patent is extended or adjusted under 35 U.S.C. 154(b) by 464 days.

(21) Appl. No.: 10/295,301

(22) Filed: Nov. 14, 2002

(65) Prior Publication Data

US 2004/0098699 A1 May 20, 2004

(51) Int. Cl.[7] .............................................. G06F 17/50
(52) U.S. Cl. ............................... 716/15; 716/16; 716/1
(58) Field of Search ........................... 716/1–18; 713/1, 713/100

(56) References Cited

U.S. PATENT DOCUMENTS

| 5,519,632 A | * | 5/1996 | Chen et al. ................... 716/15 |
| 5,900,739 A | | 5/1999 | Gaglani |
| 6,338,032 B1 | * | 1/2002 | Chen ........................... 703/16 |
| 6,678,873 B1 | * | 1/2004 | Kohashi et al. ................ 716/11 |
| 6,725,441 B1 | * | 4/2004 | Keller et al. .................. 716/16 |
| 2003/0041233 A1 | * | 2/2003 | Su et al. ......................... 713/1 |

* cited by examiner

Primary Examiner—Vuthe Siek
Assistant Examiner—Binh Tat
(74) Attorney, Agent, or Firm—Swanson & Bratschun, LLC

(57) ABSTRACT

An integrated circuit, in which one or more internal parameters may be automatically configured for a particular application, includes a plurality of program select pins, each being in a predetermined fixed state, and at least one configuration pin associated with a parameter to be adjusted. Jumpers on the system board to which the integrated circuit is mounted connect the mounting pad of each configuration pin with the mounting pad of a selected program select pin. Consequently, when the integrated circuit is mounted on the system board, each configuration pin receives a selected value which internal configuration circuitry detects and causes the corresponding parameter to be adjusted accordingly. Any of the program select pins may have functions in addition to the configuration function. When the system board is powered on or undergoes a reset, a processor internal to the chip scans each the configuration pin to determine its value. The processor then sets internal registers accordingly, completing the configuration process, and the chip may begin normal operation.

20 Claims, 3 Drawing Sheets

US 6,938,235 B2

INTEGRATED CIRCUIT WITH AUTHOMATIC PIN-STRAPPING CONFIGURATION

TECHNICAL FIELD

The present invention relates generally to the field of integrated circuits in general and configuration of internal parameters in particular.

BACKGROUND ART

An integrated circuit or "chip" is generally installed on a system board which is ultimately installed in an end product. Commonly, an integrated circuit may be purchased for use in several (or many) different end products, often by different manufacturers. Consequently, a single chip design may have to be "fine tuned" or configured for optimal performance in a particular product. Moreover, due to tolerances and other inaccuracies in other components, it may even be important to be able to configure each chip when it is installed on the system board.

It will be appreciated that it may be impractical to use a separate chip design for similar applications. However, in the past, it has also been impractical to fine tune chips with external components. One known technique requires that specified pins of the chip be tied to external fixed components having values chosen to provide the necessary adjustment to a particular chip parameter. Another technique requires the use of external variable components which can be adjusted iteratively until the chip achieves the desired level of performance. In still another technique, internal fuses or the like in parallel with circuit trimming components are "blown" to attain target values.

Pin strapping techniques have been used, for example, to test chips. An otherwise unused pin is tied to an external ground or voltage to place a chip in either a test mode or a normal operating mode.

However, there remains a need for an integrated circuit having an inexpensive and efficient method for configuring internal parameters.

SUMMARY OF THE INVENTION

The present invention provides an integrated circuit in which one or more internal parameters may be automatically configured for a particular application. The integrated circuit includes a plurality of program select pins, each being in a predetermined fixed state, and at least one configuration pin associated with a parameter to be adjusted. Jumpers on the system board to which the integrated circuit is mounted connect the mounting pad of each configuration pin with the mounting pad of a selected program select pin. Consequently, when the integrated circuit is mounted on the system board, each configuration pin receives a selected value which internal configuration circuitry detects and adjusts the corresponding parameter accordingly.

Any of the program select pins may have functions in addition to the configuration function and the present invention respects and, in fact, makes use of such other functions thereby reducing or even eliminating the need for special pins which are not used once the chip has been configured.

Preferably, each configuration pin is a digital input port (or digital input/output port). When the system board is powered on or undergoes a reset, a processor internal to the chip scans each the configuration pin to determine its value. The processor then sets internal registers accordingly, completing the configuration process, and the chip begins normal operation.

DETAILED DESCRIPTION OF THE PREFERRED EMBODIMENT

Functional Overview of Exemplary Integrated Circuit

Figure 1:
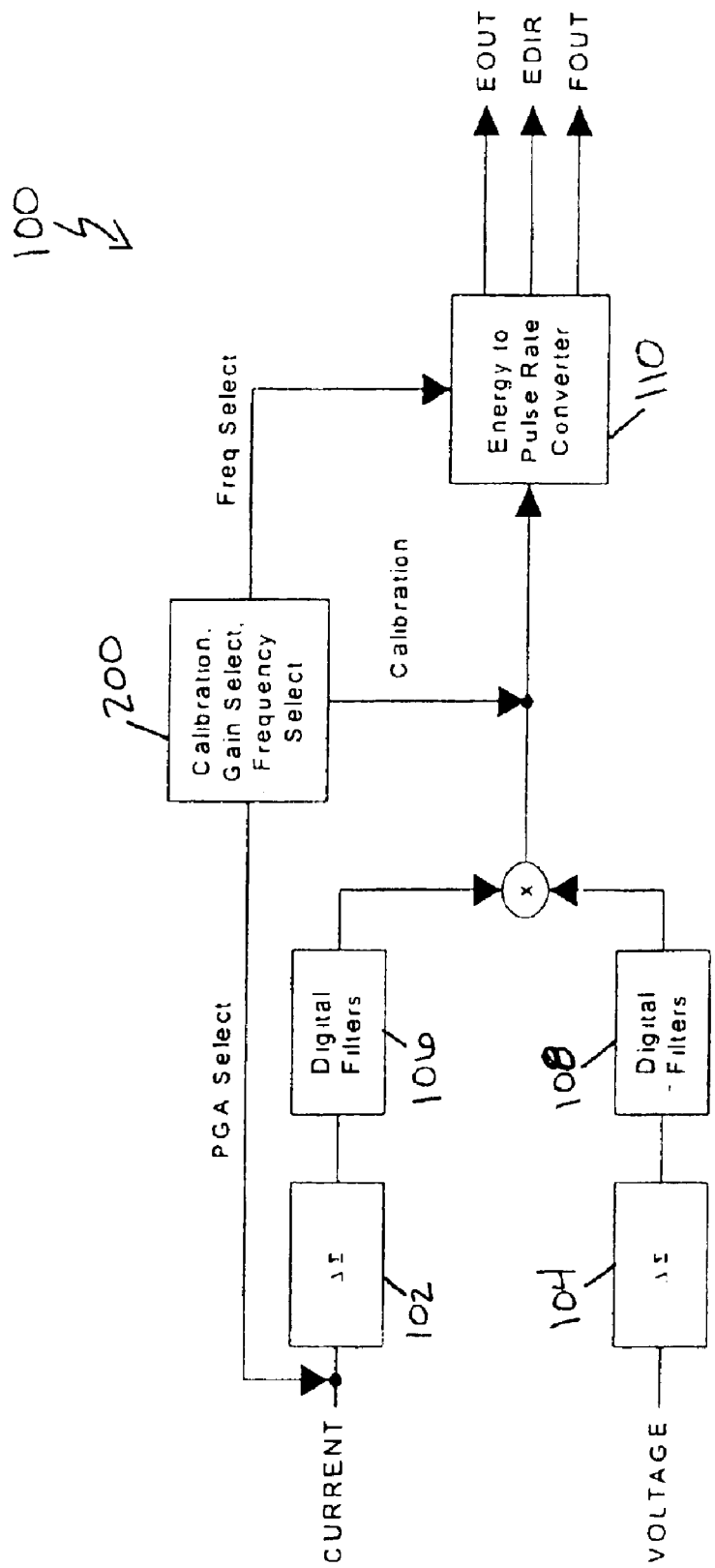
FIG. 1 is a high level functional diagram illustrating the data flow of an exemplary integrated circuit in which the present invention may be incorporated.

FIG. 1 is a high level function diagram illustrating the data flow of an exemplary integrated circuit 100 in which the present invention may be incorporated.

The particular chip 100 illustrated is a low cost power/energy integrated circuit with a pulse output, part number CS5462 designed by Cirrus Logic, Inc. The chip 100 accurately measures and calculates energy for single-phase two or three wire power metering applications and can drive a mechanical counter. Although the CS5462 100 will be used as the exemplary chip throughout this application to illustrate the present invention, such illustration should not be construed as a limitation; rather, the present invention may be incorporated with various other types of chips.

The CS5462 100 includes two delta-sigma analog-to-digital converters (ADCs) 102 and 104, one for receiving a current input and the other for receiving a voltage input, and associated digital filters 106 and 108. After being filtered, the instantaneous voltage and current digital codes are subject to value adjustments by calibration, gain and frequency select circuitry 200. Finally, the resulting signals are processes by an energy-to-pulse rate converter 110 having one output EOUT, each pulse of which represents a predetermined magnitude of energy, and a second output EDIR, each pulse of which represents the sign of the corresponding EOUT pulse. These pulsed outputs may be used to drive a mechanical counter, such as in a power meter.

Various stages of circuitry, such as calibration, gain select and frequency select, within the chip 100 may be adjusted for optimal performance. In a conventional integrated circuit, such adjustments might be made by connecting pins to external potentiometers or fixed-value components. However, a chip of the present invention avoids such methods by employing automatic internal configuration circuitry. It will be appreciated that use of external configuration components is not precluded by the present invention. In one embodiment, such components may supplement the configuration circuitry. Alternatively, a system board designer may forego or bypass the configuration circuitry entirely. However, the presence of such circuitry embedded in the integrated circuit provides the system board designer with several options.

Program Select and Configuration Pin Description

Figure 2:
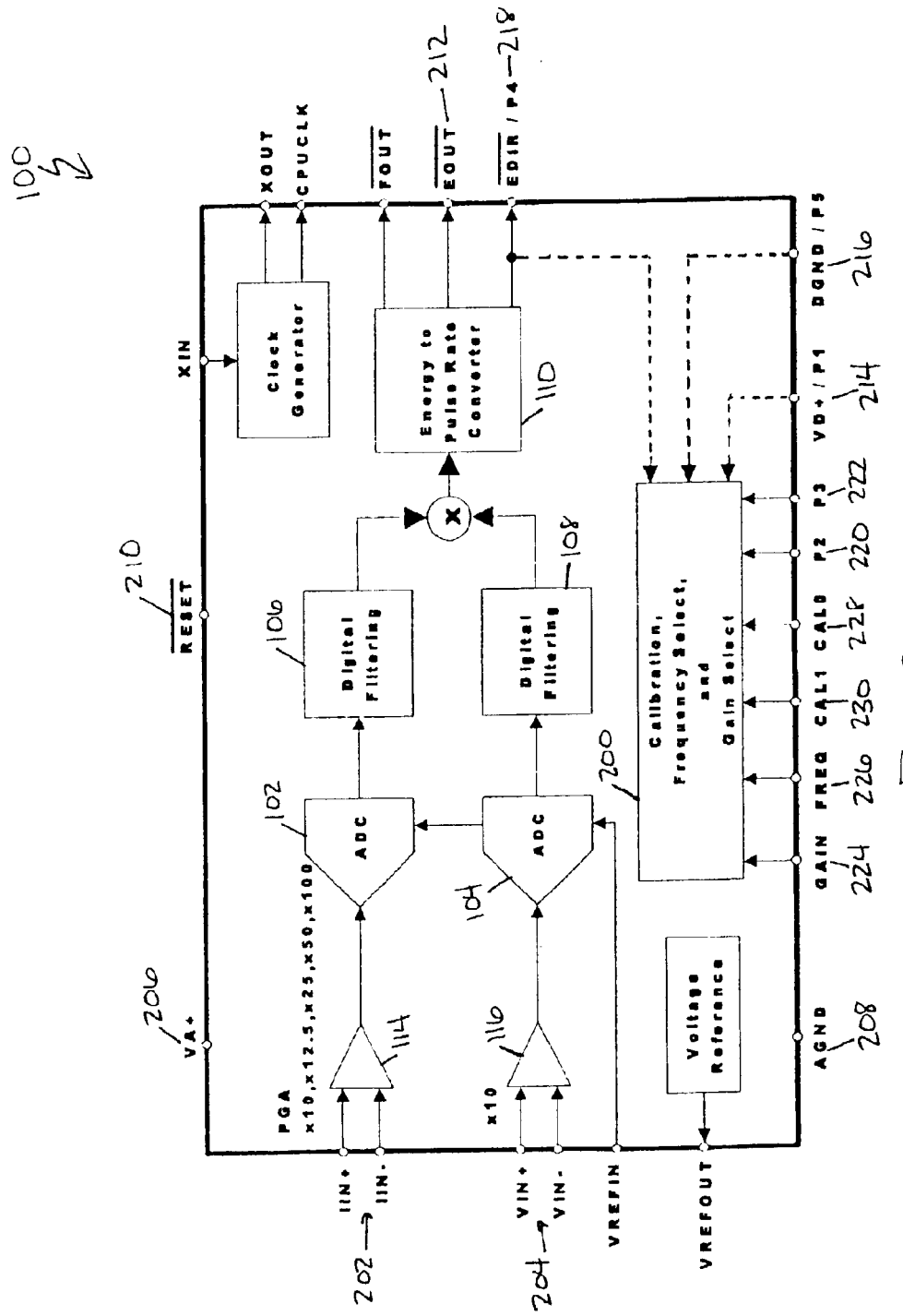
FIG. 2 is a block diagram of the integrated circuit of FIG. 1 illustrating program select and calibration pins.

FIG. 2 is a block diagram of the integrated circuit 100 of FIG. 1 illustrating the configuration circuitry 200 and program select and configuration pins. As is evident, the chip 100 includes single-use pins for conventional functions, such as current and voltage inputs 202 and 204, analog voltage supply and ground pins 206 and 208, reset 210, and a pulse output 212. Multiple-use program select pins are also associated with additional conventional functions, including digital voltage supply and ground pins P1 214 and P5 216 and the second pulse output P4 218. Single-use program select pins P2 220 and P3 222 are not associated with any conventional function. The chip 100 also includes four configuration pins: a GAIN select pin 224, a FREQUENCY select pin 226, and two calibration pins CAL0 228 and CAL1 230.

Each configuration pin 224–230 is connected by jumpers on the system board to one of the program select pins P1–P5 214–222. When the power is supplied to the chip 100, or when the chip 100 is reset, the configuration circuitry 200 enters a configuration mode and is directed by code (burned into ROM, for example, and executed by an internal processor) to scan the GAIN, FREQUENCY, CAL1 and CAL2 pins and to determine the digital value on each pin. Based on such values, the configuration circuitry then sets:

the gain of a programmable gain amplifier 114 associated with the current ADC 102;

the frequency of the energy-to-pulse rate converter 110; and the calibration adjustment for the voltage and current digital codes being sent to the converter 110.

With five program select pins and four configuration pins, a total of $5^4=625$ combinations are possible.

After the configuration has been completed, the chip 100 is accurately set to meet the desired specifications and enters a normal operation mode.

Configuration Process

Gain Configuration

The gain amplifier 116 at the voltage input 204 of the chip 100 has a fixed gain of 10×. However, the programmable gain amplifier (PGA 114) at the current input provides one of five full scale input level options. Thus, with a single +5V supply across the analog input VA+ 206 and analog ground AGND 208, both of the input channels 202 and 204 will accommodate common mode signal levels between –0.25V and +5V (VA+). The gain range is chosen by the user to be one of: 10×, 12.5×, 25×, 50× or 100×, which correspond to ranges of ±250 mV, ±200 mV, ±100 mV, ±50 mV and ±25 mV, respectively, allowing the user different input ranges on the current channel 202. As indicated in Table 1, tying the GAIN figuration pin 224 to one of the five program select pins 214–222 results in the PGA 114 being set to the desired gain.

TABLE 1

|    | CAL1   | CAL0  | FREQ  | GAIN          |
|----|--------|-------|-------|---------------|
| P1 | +5.0%  | +1%   | 1 Hz  | 25 mV (100x)  |
| P2 | +2.5%  | 0.5%  | 2 Hz  | 50 mV (50x)   |
| P3 | 0%     | 0%    | 4 Hz  | 100 mV (25x)  |
| P4 | −2.5%  | −0.5% | 8 Hz  | 200 mV (12.5x)|
| P5 | −5.0%  | −1%   | 10 Hz | 250 mV (10x)  |

Frequency Configuration

The pulse rate frequency of the EOUT and EDIR output pins 212 and 218 are similarly set by an adjustment made to the energy-to-pulse converter 110 by the configuration circuitry 200. Again referring to Table 1, tying the FREQ configuration pin 224 to one of the five program select pins 214–222 results the converter 110 being set to one of five pulse rates (1 Hz, 2 Hz, 4 Hz, 8 Hz or 10 Hz).

Internal Calibration

The CS5462 100 is designed to permit the user to calibrate the chip 100 with a user friendly digital option (although, as previously noted, the chip 100 may still be calibrated with external components). Columns 1 and 2 of Table 1 indicate the different calibration options. Both of the calibration pins CAL0 and CAL1 228 and 230 may be tied to any of the five program select pins 214–222, resulting in a calibration range of ±6% total in $5^2=25$ possible steps. To determine which combination of program select pins to tie to the CAL0 and CAL1 pins 228 and 230, the user applies a known current and known voltage to the inputs 202 and 206 of the uncalibrated chip 100. The output is measured and will be within some percentage of the expected energy value. The CAL0 and CAL1 pins 228 and 230 are then tied to the appropriate program select pins 214–222 in order to bring the output to a desired value.

If it is desired that the pulse-frequency on the EOUT pin 212 be 8 Hz and the gain on the current channel PGA 114 be 10× (250 mV), the chip 100 is mounted on the system board and the configuration pins FREQ 226 and GAIN 224 tied on the system board to program select pins P4 218 and P5 216, respectively. A known signal (for example, a 60 Hz, ±225 mV peak-to-peak sine wave) is supplied to the current and voltage inputs 202 and 204. The RMS value will be approximately 159.1 mV (~90% of full scale on each channel). If it is expected that the energy output V*I be 81% of full scale, and if the output on EOUT 212 is measured to be 85% of full scale, it will be necessary to adjust the output down by about 5% (0.85/0.81=~104.94%). Consequently, configuration pin CAL0 228 should be tied to program select pin P3 and configuration pin CAL1 230 should be tied to program select pin P5 216, thereby shifting the output down to be within the accuracy level of the original input signal. Other combinations of CAL0 and CAL1 may be made to achieve other desired results.

EXAMPLE

Figure 3:
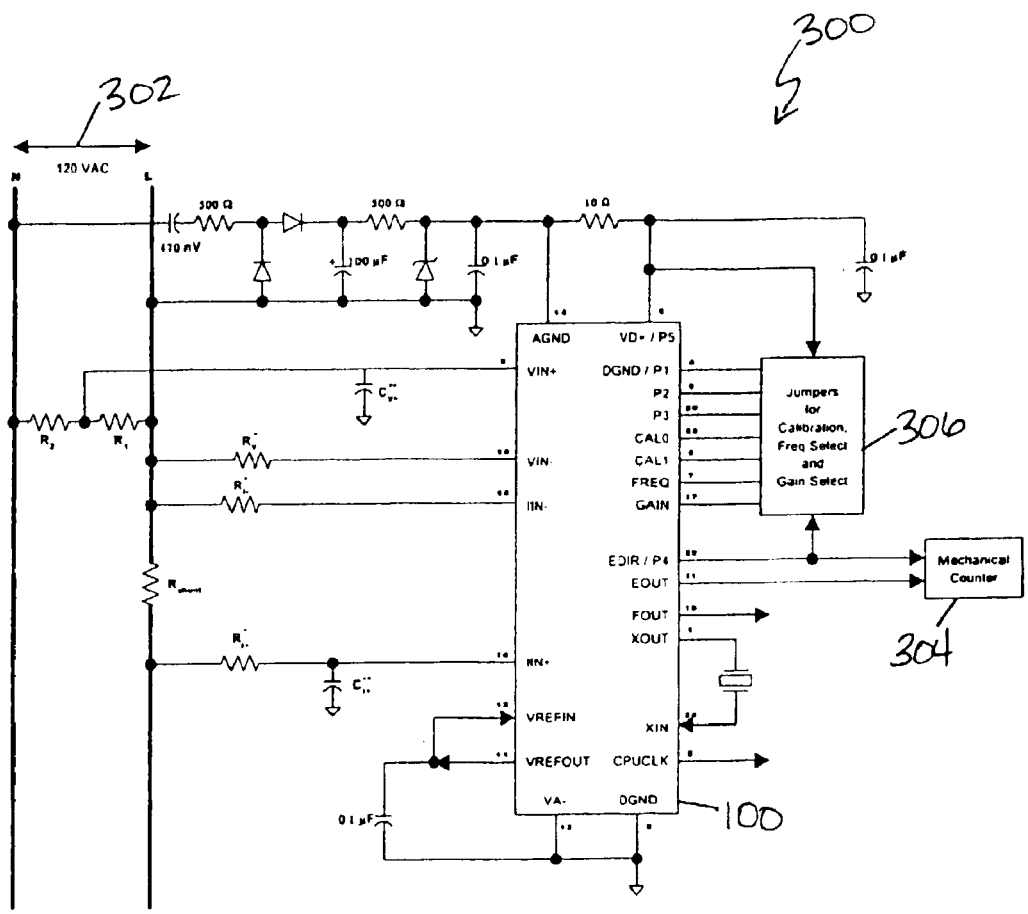
FIG. 3 is a block diagram of the integrated circuit of FIG. 1 in the context of circuitry on a system board.

FIG. 3 illustrates an integrated circuit (the exemplary CS5462) 100 of the present invention mounted on a system board 300. The board 300 is connected to a single-phase, two-wire service mains 302 and various board components are connected to the chip 100 to measure the power used. The power is tracked by and read from a mechanical counter 304. The configuration pins 224–228 are tied to the program select pins P1–P5 214–218 through jumpers or the like 306 on the system board 300.

The objects of the invention have been fully realized through the embodiments disclosed herein. Those skilled in the art will appreciate that the various aspects of the invention may be achieved through different embodiments without departing from the essential function of the invention. The particular embodiments are illustrative and not meant to limit the scope of the invention as set forth in the following claims.

What is claimed is:

1. A configurable integrated circuit for mounting on a system board, comprising:

a plurality of program select pins, each being in a predetermined, fixed state when the integrated circuit is mounted on the system board;

a first configuration pin associated with an integrated circuit parameter to be adjusted, said first configuration pin being connected to one of said plurality of program select pins when the integrated circuit is mounted on the system board;

means for determining to which of said plurality of program select pins said first configuration pin is connected; and configuration circuitry for adjusting the parameter to one of a plurality of predetermined adjustment values corresponding to the program select pin to which said first configuration pin is connected.

2. The integrated circuit of claim 1, wherein said configuration circuitry comprises circuitry for adjusting the gain of a programmable gain amplifier.

3. The integrated circuit of claim 1, wherein said configuration circuitry comprises circuitry for adjusting the pulse rate frequency of an output of the integrated circuit.

4. The integrated circuit of claim 1, wherein said configuration circuitry comprises circuitry for adjusting the range of permissible magnitudes of an input of the integrated circuit.

5. The integrated circuit of claim 1, wherein:
the parameter is adjustable to one of a plurality of predetermined adjustment values, each of the adjustment values being associated with one of said program select pins; and
said configuration circuitry comprises means for adjusting the parameter by an amount equal to the predetermined adjustment value corresponding to the program select pin to which said first configuration pin is connected.

6. The integrated circuit of claim 1 further comprising a second configuration pin, wherein:
said first and second configuration pins are both associated with the integrated circuit parameter to be adjusted; and
said means for determining comprises means for determining to which of said plurality of program select pins said first and second configuration pins are connected.

7. The integrated circuit of claim 6, wherein:
the number of program select pins equals x;
the parameter is adjustable to one of $x^2$ predetermined adjustment values;
said configuration circuitry comprises means for adjusting the parameter by an amount equal to the sum of:
the adjustment value in a first group of x of the $x^2$ adjustment values corresponding to the program select pin to which the first configuration pin is connected, plus
the adjustment value in a second group of x of the $x^2$ adjustment values corresponding to the program select pin to which the second configuration pin is connected.

8. The integrated circuit of claim 1 further comprising a plurality y of configuration pins, including said first configuration pin, associated with a plurality z of parameters to be adjusted, including the first parameter, where $y \geq z$, wherein said means for determining comprises means for determining to which of said plurality of program select pins each of said plurality of configuration pins is connected.

9. The integrated circuit of claim 8, wherein:
the number of program select pins equals x;
said first configuration pin is associated with the first of the z parameters;
said first parameter is adjustable to one of x predetermined adjustment values in a first set of predetermined adjustment values, each of the x adjustment values in the first set is associated with one of said x program select pins; and
said configuration circuitry comprises means for adjusting the first parameter by an amount equal to the predetermined adjustment value of the first set corresponding to the program select pin to which said first configuration pin is connected.

10. The integrated circuit of claim 9, wherein:
a second of said y configuration pins is associated with a second of said z parameters;
the second of said z parameters is adjustable to one of x predetermined adjustment values in a second set of predetermined adjustment values; and
said configuration circuitry comprises means for adjusting the second parameter by an amount equal to the predetermined adjustment value of the second set of values corresponding to the program select pin to which said second configuration pin is connected.

11. The integrated circuit of claim 10, wherein:
a third and a fourth of said y configuration pins are associated with a third of said z-parameters;
the third parameter is adjustable to one of $x^2$ predetermined adjustment values in a third set of predetermined adjustment values;
a first group of x of the $x^2$ adjustment values is associated with said third configuration pin;
a second group of x of the $x^2$ adjustment values is associated with said fourth configuration pin; and
said configuration circuitry comprises means for adjusting the third parameter by an amount equal to the sum of:
the adjustment value corresponding to the program select pin to which said third configuration pin is connected; plus
the adjustment value corresponding to the program select pin to which said fourth configuration pin is connected.

12. The integrated circuit of claim 1, wherein one or more of said program select pins is coupled to circuitry within the integrated circuit.

13. The integrated circuit of claim 12, wherein one of said one or more program select pins is coupled to a digital ground within the integrated circuit.

14. The integrated circuit of claim 12, wherein one of said one or more program select pins is coupled to a digital supply within the integrated circuit.

15. A method for configuring an integrated circuit to be mounted on a system board, comprising:
providing a plurality of program select pins on the integrated circuit, each being in a predetermined, fixed state when the integrated circuit is mounted on the system board;
providing a first configuration pin on the integrated circuit associated with an integrated circuit parameter to be adjusted, the first configuration pin being connected to one of the plurality of program select pins when the integrated circuit is mounted on the system board;
determining to which of the plurality of program select pins the first configuration pin is connected; and
configuration circuitry for adjusting the parameter to one of a plurality of predetermined adjustment values corresponding to the program select pin to which said first configuration pin is connected.

16. The integrated circuit of claim 15, further comprising:
associating each of the plurality of program select pins with a corresponding one of a first group of predetermined adjustment values; and
adjusting the parameter by an amount equal to the predetermined adjustment value corresponding to the program select pin to which the first configuration pin is connected.

17. The method of claim 15, further comprising:
providing a second configuration pin on the integrated circuit;

associating both the first and second configuration pins with the integrated circuit parameter to be adjusted; and determining to which of the plurality of program select pins the first and second configuration pins are connected.

18. The method of claim 17, further comprising:

associating a first group of predetermined adjustment values with the first configuration pin;

associating a second group of predetermined adjustment values with the second configuration pin;

adjusting the parameter by an amount equal to the sum of:
    the adjustment value from the first group corresponding to the program select pin to which the first configuration pin is connected; plus
    the adjustment value from the second group corresponding to the program select pin to which the second configuration pin is connected.

19. The method of claim 15, further comprising:

providing a plurality y of configuration pins, including the first configuration pin, associated with a plurality z of parameters to be adjusted, including the first parameter, where $y \geq z$; and determining to which of the plurality of program select pins each of the plurality of configuration pins is connected.

20. The method of claim 19, further comprising:

associating a third and a fourth of the y configuration pins with a third of the z parameters, the third parameter being adjustable to one of $x^2$ predetermined adjustment values;

associating a first group of x of the $x^2$ adjustment values with the third configuration pin;

associating a second group of x of the $x^2$ adjustment values with the fourth configuration pin; and adjusting the third parameter by an amount equal to the sum of:
    the adjustment value corresponding to the program select pin to which the third configuration pin is connected; plus
    the adjustment value corresponding to the program select pin to which the fourth configuration pin is connected.

* * * * *